United States Patent
Shoda et al.

(10) Patent No.: US 8,129,928 B2
(45) Date of Patent: Mar. 6, 2012

(54) POWER BRANCHING SYSTEM AND POWER BRANCHING METHOD

(75) Inventors: Kazuo Shoda, Tokyo (JP); Yuki Nomura, Tokyo (JP); Toshiyuki Aso, Tokyo (JP)

(73) Assignee: THK Co., Ltd., Tokyo (JP)

( * ) Notice: Subject to any disclaimer, the term of this patent is extended or adjusted under 35 U.S.C. 154(b) by 473 days.

(21) Appl. No.: 12/376,108

(22) PCT Filed: Aug. 1, 2007

(86) PCT No.: PCT/JP2007/065087
§ 371 (c)(1),
(2), (4) Date: Feb. 2, 2009

(87) PCT Pub. No.: WO2008/016086
PCT Pub. Date: Feb. 7, 2008

(65) Prior Publication Data
US 2009/0309529 A1    Dec. 17, 2009

(30) Foreign Application Priority Data
Aug. 2, 2006 (JP) ................................. 2006-210518

(51) Int. Cl.
*H02K 41/00* (2006.01)
(52) U.S. Cl. ............ 318/135; 318/38; 318/432; 361/25; 361/26; 361/30
(58) Field of Classification Search .................. 318/135, 318/38, 432; 361/25, 26, 30
See application file for complete search history.

(56) References Cited

U.S. PATENT DOCUMENTS

| 5,327,117 A * | 7/1994 | Kohsaka ........................ 340/525 |
| 6,437,955 B1 * | 8/2002 | Duffy et al. ...................... 361/45 |
| 7,196,488 B2 * | 3/2007 | Matsubara et al. ........... 318/599 |
| 2004/0183497 A1 | 9/2004 | Okita et al. |

FOREIGN PATENT DOCUMENTS

JP    53119517 U  *  3/1977
(Continued)

OTHER PUBLICATIONS

International Search Report of PCT/JP2007/065087, Mailing Date of Nov. 6, 2007.

(Continued)

*Primary Examiner* — Walter Benson
*Assistant Examiner* — Jorge Carrasquillo
(74) *Attorney, Agent, or Firm* — Westerman, Hattori, Daniels & Adrian, LLP

(57) ABSTRACT

Provided is a power branching system for driving a plurality of motors by use of a single servo driver, the power branching system capable of protecting each of the motors.
The power branching system of the present invention has power lines 15 branched at some midpoint to connect the plural motors 5 and the servo driver 12; a plurality of current sensors 21 provided at branched power lines 15b for detecting currents supplied to the respective motors 5; and controlling means 22 for receiving current data detected by the plural current sensors 21, determining whether or not the detected currents are balanced and generating an alarm signal when the currents are unbalanced.

7 Claims, 5 Drawing Sheets

FOREIGN PATENT DOCUMENTS

| | | | |
|---|---|---|---|
| JP | 53-119517 T3 | | 9/1977 |
| JP | 53119517 | * | 9/1977 |
| JP | 60-128497 U | | 8/1985 |
| JP | 60128497 | * | 8/1985 |
| JP | 60128497 U | * | 8/1985 |
| JP | 8-266092 A | | 10/1996 |
| JP | 08266092 A | * | 10/1996 |
| JP | 10-9187 A | | 1/1998 |
| JP | 2000-092895 A | | 3/2000 |
| JP | 2002-095290 A | | 3/2002 |
| JP | 2003-284388 A | | 10/2003 |
| JP | 2003284388 A | * | 10/2003 |
| JP | 2004-236433 A | | 8/2004 |
| JP | 2006-050875 A | | 2/2006 |

OTHER PUBLICATIONS

Notification of Transmittal of Translation of the International Preliminary Report on Patentability (Form PCT/IB/338) of International Application No. PCT/JP2007/065087 mailed Feb. 19, 2009 with Forms PCT/IPEA/409.

Chinese Office Action dated Jun. 9, 2010, issued in corresponding Chinese Patent Application No. 200780028869.5.

Chinese Office Action dated Aug. 1, 2011, issued in corresponding Chinese Patent Application No. 200780028869.5.(w/English translation of the cover page).

* cited by examiner

POWER BRANCHING SYSTEM AND POWER BRANCHING METHOD

TECHNICAL FIELD

The present invention relates to a power branching system and a power branching method for driving a plurality of motors with a single servo driver, and more particularly, to a power branching system and a power branching method capable of protecting the plural motors from overload.

BACKGROUND ART

A linear motor is conceptually a motor whose rotary stator and rotor are extended linearly and converts electric energy directly to linear power (thrust). As it is direct driving, does not need any power transmission mechanism such as gear and generates linear power, the linear motor has the advantage of good power transmission efficiency and the disadvantage of being difficult to get large power.

DISCLOSURE OF INVENTION

Problems to be Solved by the Invention

In order to overcome this disadvantage, plural linear motors are used as being connected in series or in parallel. For example, when linear motors are used to move a gate-shaped frame of a machine tool linearly, linear motors in a pair are mounted on respective lower parts of two columns of the frame and driven synchronously. If power is not enough, as shown in FIG. 6, movers M1 and M2 of two linear motors are often connected to a table 31 to generate more power. In this example, a permanent magnet as stator is mounted on a rail 32 and commonly used for both of the movers M1 and M2.

When plural linear motors are used in series or parallel, they need to be driven synchronously as they are connected to a rigid body. If a servo driver is provided on each of the plural linear motors, the servo driver needs to be driven with the master-slave relationship, which complicates control of the linear motors. Hence, there is prepared one servo driver having a capacity of combined outputs of the linear motors and this single servo driver is used to drive the plural linear motors synchronously thereby to realize simple control. Such control needs the movers of the plural motors to be in phase relative to the respective stators. Accordingly, it is assumed that the linear motors are mounted with high mounting accuracy.

When the single servo driver is used to drive the plural linear motors synchronously, power lines for supplying power from the servo driver 33 to the linear motors 36 are split by a branch connector 34 as shown in FIG. 6. As three-phase AC current passes through the power lines 35, each of the power lines 35 for U, V and W phase currents is branched by the branch connector 34. The servo driver 33 is provided with current sensors 37 for controlling the linear motors 36. The servo driver 33 has a capacity corresponding to combined outputs of the plural linear motors 36. When the rated outputs and loads of the linear motors 36 are equal to each other, the current output from the servo driver 33 is divided equally by the branch connector 34. For example, when the current fed from the servo driver 33 is 2A, the current is divided into two currents of 1A by the branch connector 34, which are fed to the respective linear motors 36.

However, in the above-mentioned power branching system, when a branched power line is broken, current output from the servo driver flows to only one linear motor, which may be damaged due to over current. Such a problem is caused not only when the power line is broken, but also when there is a large mounting error of the plural linear motors and the loads on the linear motors are unbalanced. As there is a need to control the linear motors, the current sensor is provided at the power line before the power line is branched and it detects the current passing through the power line that has not yet branched. For this reason, the current sensor cannot detect such an abnormal condition that over current passes through a branched power line to a liner motor.

Then, the present invention has an object to provide a power branching system and a power branching method for driving plural motors with a single servo driver which are capable of protecting the motors.

Means for Solving the Problem

In order to solve the above-mentioned problems, according to one aspect of the present invention, there is provided a power branching system for driving a plurality of linear motors synchronously by use of a single servo driver, the linear motors being connected to a rigid body, the power branching system comprising: a power line branched at some midpoint to connect the plural linear motors to the servo driver; a plurality of current sensors provided at respective branched power lines for detecting currents supplied to the respective linear motors; and controlling means for receiving data of the currents detected by the current sensors, determining whether or not the currents are balanced and generating an alarm signal when the currents are unbalanced.

According to another aspect of the present invention, in the power branching system, the controlling means calculates a difference or ratio of the currents detected by the current sensors, determines whether or not the difference is greater than or equal to a predetermined threshold value or whether or not the ratio falls within a predetermined normal range, and generates the alarm signal when the difference is greater than or equal to the predetermined threshold value or when the ratio falls outside the predetermined normal range According to another aspect of the present invention, in the power branching system, the controlling means determines based on the currents detected by the current sensors whether or not any of the linear motors is overloaded, and generates the alarm signal when the linear motor is overloaded.

According to another aspect of the present invention, there is provided a power branching system for driving a plurality of linear motors synchronously by use of a single servo driver, the linear motors being connected to a rigid body, the power branching system comprising: a power line branched at some midpoint to connect the plural linear motors to the servo driver; a plurality of current sensors provided at respective branched power lines for detecting currents supplied to the respective linear motors; and controlling means for receiving data of the currents detected by the current sensors, determining based on the currents whether or not any of the linear motors is overloaded, and generates an alarm signal when the linear motor is overloaded.

According to another aspect of the present invention, in the power branching system, the controlling means determines whether or not each of the currents detected by the current sensors is greater than or equal to a predetermined threshold value and generates the alarm signal when the current is greater than or equal to the predetermined threshold value.

According to another aspect of the present invention, in the power branching system a display device for displaying the currents detected by the current sensors.

According to another aspect of the present invention, there is provided is a power branching method for driving a plurality of linear motors synchronously by use of a single servo driver, the linear motors being connected to a rigid body, the power branching method comprising: branching a power line at some midpoint to connect the plural linear motors to the servo driver; providing a plurality of current sensors at respective branched power lines to detect currents supplied to the respective linear motors; and determining whether or not the currents are balanced, and generating an alarm signal when the currents are unbalanced.

In another aspect of the present invention, there is provided a power branching method for driving a plurality of linear motors synchronously by use of a single servo driver, the linear motors being connected to a rigid body, the power branching method comprising: branching a power line at some midpoint to connect the plural linear motors to the servo driver; providing a plurality of current sensors at respective branched power lines to detect currents supplied to the respective linear motors; and determining based on the currents whether or not any of the linear motors is overloaded, and generating an alarm signal when the linear motor is overloaded.

Effects of the Invention

According to an aspect of the present invention, an alarm signal is generated under abnormal conditions that the currents supplied to the plural linear motors are unbalanced. This makes it possible to protect the linear motors.

According to another aspect of the present invention, it is possible to know abnormal conditions that the currents supplied to the plural linear motors are unbalanced.

According to another aspect of the present invention, an alarm signal is generated under abnormal conditions that overload is applied to any linear motor. This makes it possible to protect the linear motor.

According to another aspect of the present invention, an alarm signal is generated under abnormal conditions that overload is applied to any linear motor. This makes it possible to protect the linear motor.

According to another aspect of the present invention, it is possible to know abnormal conditions that overload is applied to any linear motor.

According to another aspect of the present invention, it is possible to know a value of current passing through each linear motor.

According to another aspect of the present invention, an alarm signal is generated under abnormal conditions that the currents supplied to the plural linear motors are unbalanced. This makes it possible to protect the linear motor.

According to another aspect of the present invention, an alarm signal is generated when overload is applied to any linear motor, which makes it possible to protect the linear motor.

BEST MODES FOR CARRYING OUT THE INVENTION

With reference to the attached drawings, an embodiment of the present invention will be described in detail below. A power branching system of this embodiment is provided between a servo driver and a plurality of linear motors to divide current output from the servo driver into the plural linear motors.

Figure 1:
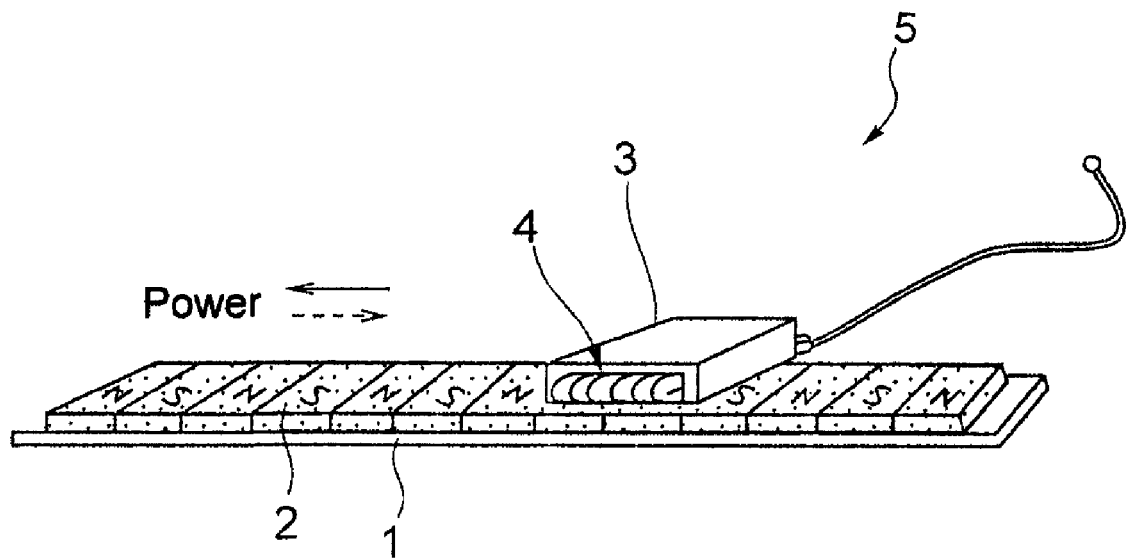
FIG. 1 is a perspective view of a movable coil type permanent magnet synchronous linear motor.

FIG. 1 shows a movable coil type permanent magnet synchronous linear motor as an example of a linear motor 5. The movable coil type permanent magnet synchronous linear motor has N-pole and S-pole permanent magnets 2 arranged alternately at a stator 1 side and U, V and W-phase coils 4 wound at the mover 3 side. As the three-phase armature current passes through the coils 4, there is generated a moving magnetic field moving linearly and the mover 3 moves linearly relative to the stator 1.

Figure 2:
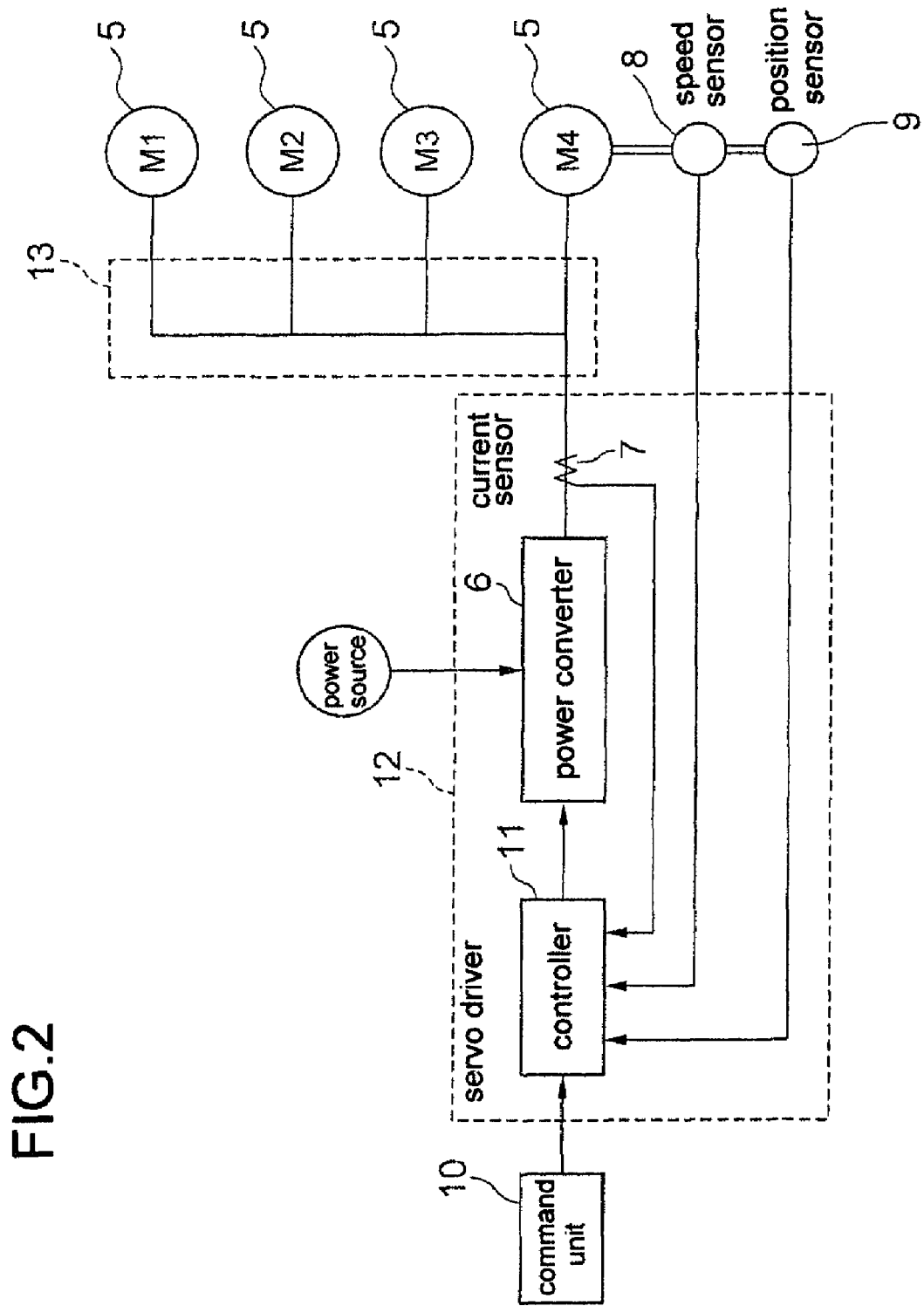
FIG. 2 is a block diagram of a servo driver.

FIG. 2 shows a configuration of a servo driver for controlling linear motors. The servo driver has a power converter 6, such as a voltage-type PWM inverter, for supplying power in a suitable manner to control the linear motors 5, a current sensor 7 for detecting the entire current passing through the plural linear motors 5 so as to control the linear motors 5; a speed sensor 8 for detecting the speed of each linear motor 5, a position sensor 9 for detecting the position of each linear motor 5; and a controller 11 for controlling the power converter 6 based on the information from the speed sensor 8, the position sensor 9, the current sensor 7 and a command unit 10. The servo driver 12 includes the controller 11, the power converter 6 and the current sensor 7. The power branching system 13 is provided between the servo driver 12 and the plural linear motors 5 for dividing current from the servo driver 12 into the plural linear motors 5, for example, four linear motors 5.

Figure 3:
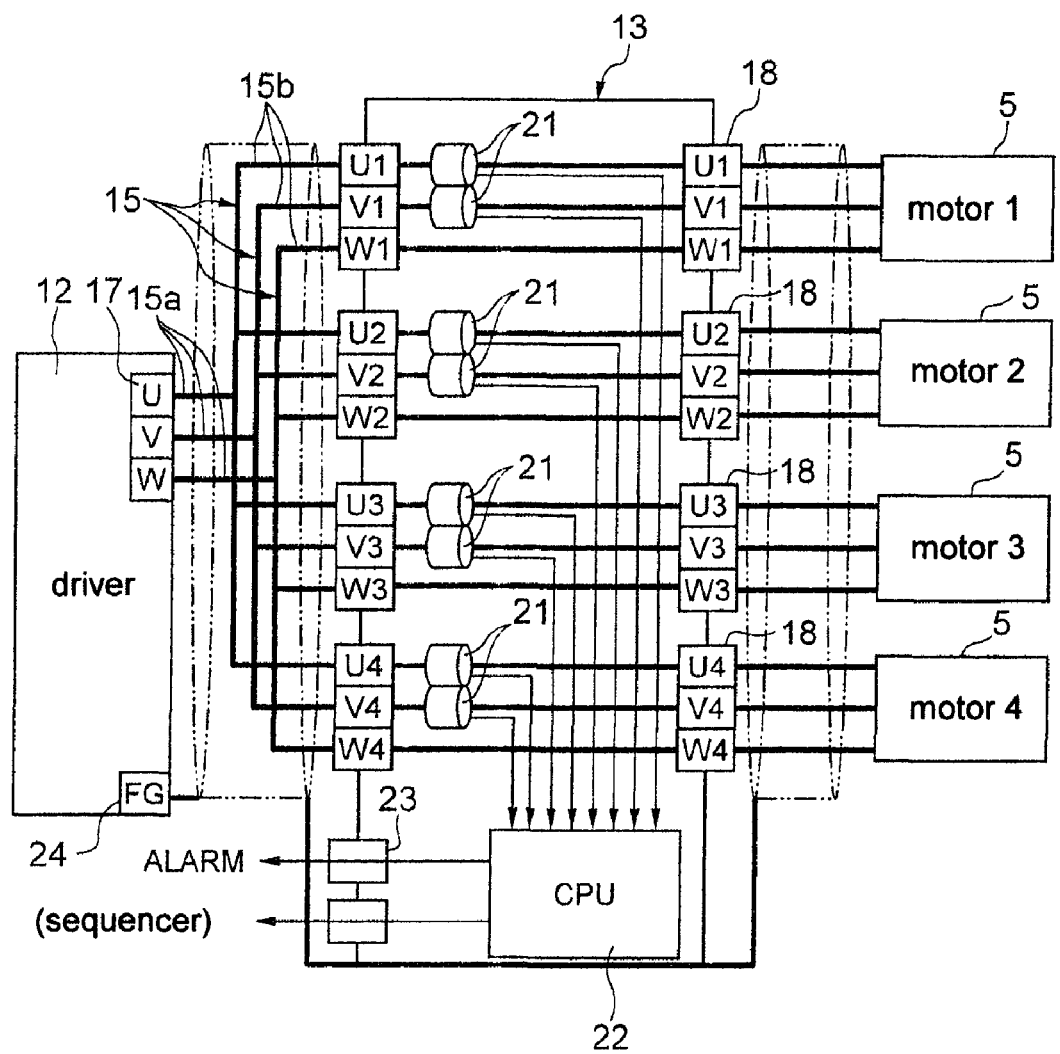
FIG. 3 is a block diagram of a power branching system according to an embodiment of the present invention.

FIG. 3 shows the configuration of the power branching system 13. On the substrate of the power branching system 13, there is formed an electrode pattern which becomes power lines 15. The power lines have primary power lines 15a which are connected to the servo driver 12. Each of the primary power lines 15a is divided at some midpoint into four secondary power lines 15b, which are connected to respective linear motors 5. The primary power lines 15a are three power lines 15a, that is, U-phase power line, V-phase power line and W-phase power line, and each of them is divided into four secondary power lines 15b. The primary power lines 15a are connected to output terminals 17 of the servo driver 12. The secondary power lines 15b are connected to terminals 18, to which are connected wirings of the respective linear motors 5.

The branched U-phase and V-phase power lines 15b (secondary power lines 15b) are provided with current sensors 21. As the secondary power lines 15b are connected to the respective linear motors 5, current detected by each current sensor 21 is a current supplied to a corresponding linear motor 5. This current sensor 21 differs from the current sensor 7 and is not for controlling the linear motors 5 but for serving as a monitoring current sensor for protecting the linear motors 5. In this example, the primary power lines 15a are divided into the four secondary power lines 15b, U1 to U4, and the four secondary power lines 15b, V1 to V4, and totally eight current sensors 21 are provided. In view of coil connection of the linear motors 5, a W-phase current W is expressed with use of a U-phase current U and a V-phase current V as "W=−U−V". As the W-phase current W is obtained from the U-phase current U and the V-phase current V, current sensors for W-phase current are omitted here.

On the substrate of the power branching system 13, there is a CPU (central processing unit) provided as controlling means. Current data detected by the current sensors 21 are input into the CPU 22. The CPU 22 receives the current data from the current sensors 21 and executes programs for protecting the linear motors 5 based on the current data. Then, when there occurs such an anomaly that over current flows in any linear motor 5, the CPU 22 generates an alarm signal so as to make current flow into an LED 23 (light-emitting diode) thereby emitting light or to generate an audible alarm. This alarm signal may be output to a machine sequencer to be used as a stop signal for stopping the operation of the servo driver 12. Further, the power branching system 13 is provided with a display device (not shown) such as a liquid crystal display for displaying current values detected by the current sensors 21. Needless to say, power is applied to the power branching system 13 to operate the current sensors 21, the CPU 22 and the display device. Preferably, the power can be switched between AC 100 V input and AC 200 V input. Here, FG 24 in FIG. 3 stands for a frame grand, which is usually connected to a ground.

Figure 4:
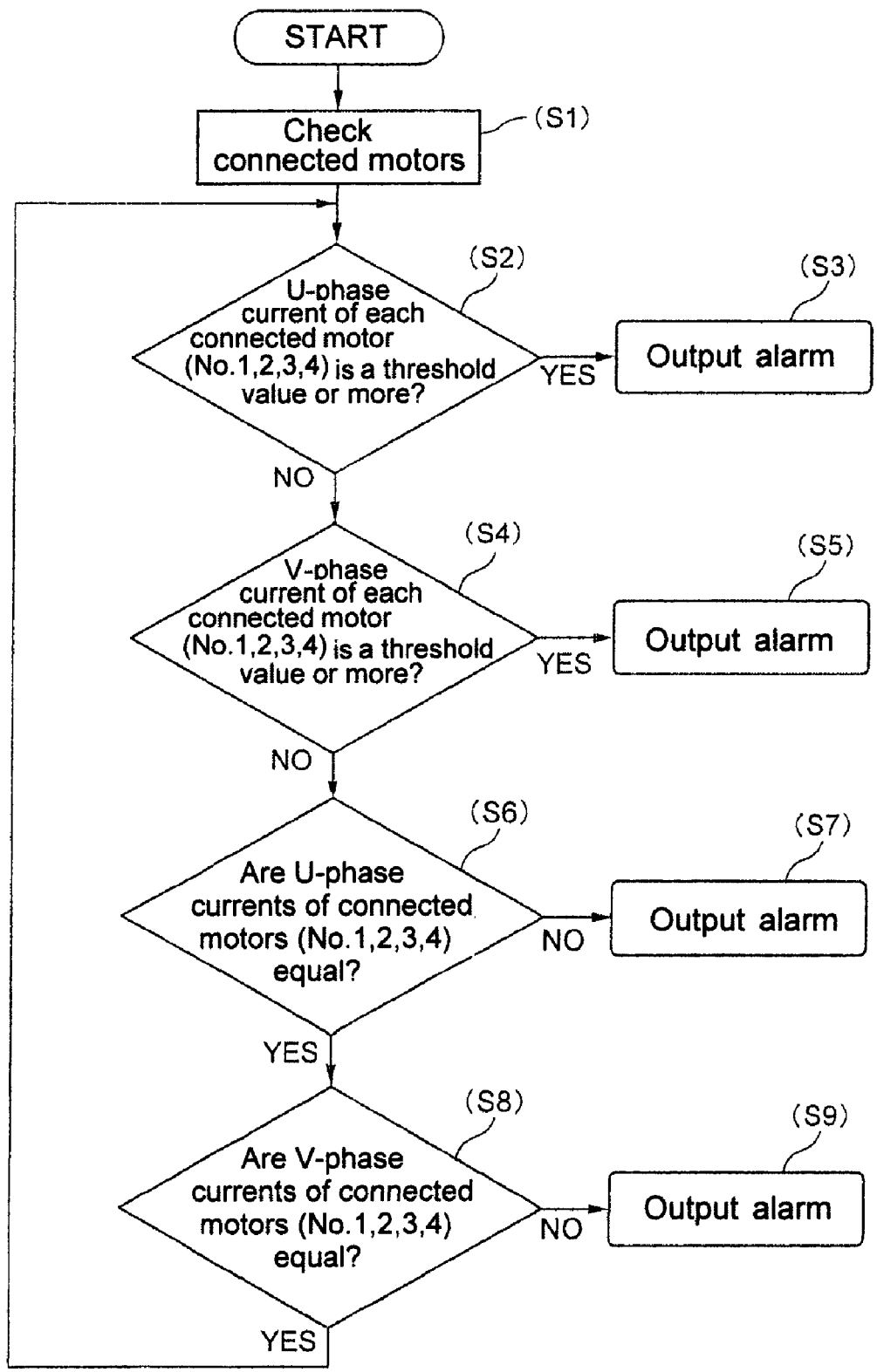
FIG. 4 is a flow chart of a program for detecting overload and current balance.

FIG. 4 shows a flow chart of the programs executed by the CPU 22. The programs are stored in a memory such as a ROM. These programs are executed every predetermined sampling period of 1 msec, 2 msec, for example.

First, a switch or a parameter set value is used to determine which linear motor 5 is connected (S1). In this embodiment, as four or less linear motors 5 are connectable, there is a need to confirm how many out of the four linear motors 5 are connected. Then, the following steps are made only as to the connected linear motors 5.

The CPU 22 takes in the current data from the current sensors 21 and determines whether or not there is any linear motor 5 that bears overload and whether or not the currents supplied to the plural linear motors 5 are balanced. In other words, the CPU 22 determines whether or not a load applied to each linear motor 5 and current balance among the plural linear motors 5 are proper.

When the power lines 15b of a part of the linear motors 5 are disconnected (broken), over current flows into the other linear motors 5. For example, it is assumed each of two linear motors 5 is driven with a current of 5 A. When the power line 15b of one linear motor 5 is disconnected, the current flowing into the linear motor 5 becomes 0 A and the current passing through the other linear motor 5 becomes 10 A that is over current. When over current flows into the linear motor 5, the linear motor 5 may produce heat and become damaged. Therefore, determination of overload of the linear motor 5 is performed for preventing damage to the linear motor 5.

Although the power line is not so far as to be disconnected, the currents of the plural linear motors 5 are sometimes unbalanced due to load unbalance, mounting errors or the like. For example, the current ratio between two linear motors 5 may be unbalanced, such as 3:7 or 4:6, though the ratio becomes 10:0 when the power line is disconnected. If the linear motors 5 are driven with unbalanced current ratio, large current flows into some of the linear motors 5 for the long term and the linear motors 5 may produce heat and get damaged. In view of this, the current balance of the plural linear motors 5 is judged thereby to be able to prevent such damage to the linear motors 5. Besides, determination of unbalance of the currents of the plural linear motors 5 makes it possible to correct mounting errors or load balance of the linear motors 5 so as to keep the currents of the plural linear motors 5 balanced. This correction is made while monitoring the currents of the current sensors 21 displayed on the display device.

The step for the CPU 22 judging the overload of each linear motor 5 is performed as follows. First, the CPU 22 determines whether current detected by each of the plural U-phase current sensors 21 is greater than or equal to a predetermined threshold value (preset value) or not (S2). The threshold value is predetermined by a switch or parameter set value. Then, when the current detected by the U-phase current sensor 21 is greater than or equal to the predetermined threshold value, an alarm signal is generated (S3). When the current detected by the U-phase current sensor 21 is smaller than the predetermined threshold value, the process goes to the next step. The step of judging the overload of the linear motors is performed for each linear motor.

At the next step (S4), it is determined whether the current detected by each of the V-phase current sensors 21 is greater than or equal to a predetermined threshold value. This is because each of the linear motors 5 is supplied with U-phase current and V-phase current separately via respective power lines 15b. The threshold is predetermined by a switch or parameter set value. Then, when the current detected by the V-phase current sensor 21 is greater than or equal to the predetermined threshold value, an alarm signal is generated (S5). When the current detected by the U-phase current sensor 21 is smaller than the predetermined threshold value, it is assumed that the linear motor 5 is not overloaded, and the process goes to the next steps of judging the current balance (S6 to S9).

As the W-phase current satisfies the relation of $W=-U-V$, when the U-phase and V-phase power lines do not carry over current, the W-phase power line also does not carry over current. Therefore, the step of determining whether or not the W-phase power line carries over current can be omitted.

In the above-mentioned step of judging the overload of each linear motor 5, it is determined whether or not an instant current of the current sensor 21 is greater than or equal to a predetermined threshold value. Besides, a cumulative load may be calculated with the current and time thereby to determine whether or not the cumulative load is greater than or equal to a predetermined threshold value. Such use of the cumulative load makes it possible to protect the linear motors 5 even when a load slightly larger than the rated output is applied continuously over the long term.

In the step of judging the current balance of the plural linear motors 5 (S6), a difference between currents detected by the plural current sensors 21 is obtained to determine whether or not the difference is greater than or equal to a threshold value. The threshold value of the current difference is predetermined by a switch or parameter set value. Specifically, for example, a current of the U1-phase current sensor 21 is used as a reference and a difference between this current and each of currents detected by U2-phase, U3-phase and U4-phase current sensors (U2−U1, U3−U1, U4−U1) is obtained. Then, it is determined whether or not an absolute value of the difference is greater than or equal to the predetermined threshold value. When the absolute value of the difference is greater than or equal to the predetermined threshold value, the currents are assumed to be unbalanced and an alarm signal is generated (S7).

Besides, when the ratio is used to determine the current balance, U2/U1, U3/U1 and U4/U1 are calculated. When the ratio falls within a predetermined normal range (for example, 0.8 to 1.2), the current balance is assumed to be proper. When the ratio falls outside the predetermined normal range (for example, 0.8 to 1.2), the current balance is assumed to be improper and an alarm signal is generated (S7).

Once the currents detected by the plural U-phase current sensors 21 are balanced, balance of the currents detected by the plural V-phase current sensors 21 is judged (S8). The method for judging the balance of the currents detected by the V-phase current sensors 21 is the same as that for judging the balance of the currents detected by the U-phase current sensors 21. When the currents detected by the V-phase current sensors 21 are unbalanced, an alarm signal is generated (S9). When the currents are balanced, the process goes back to the step S2, where it is determined whether over current flows into each linear motor 5.

Figure 5:
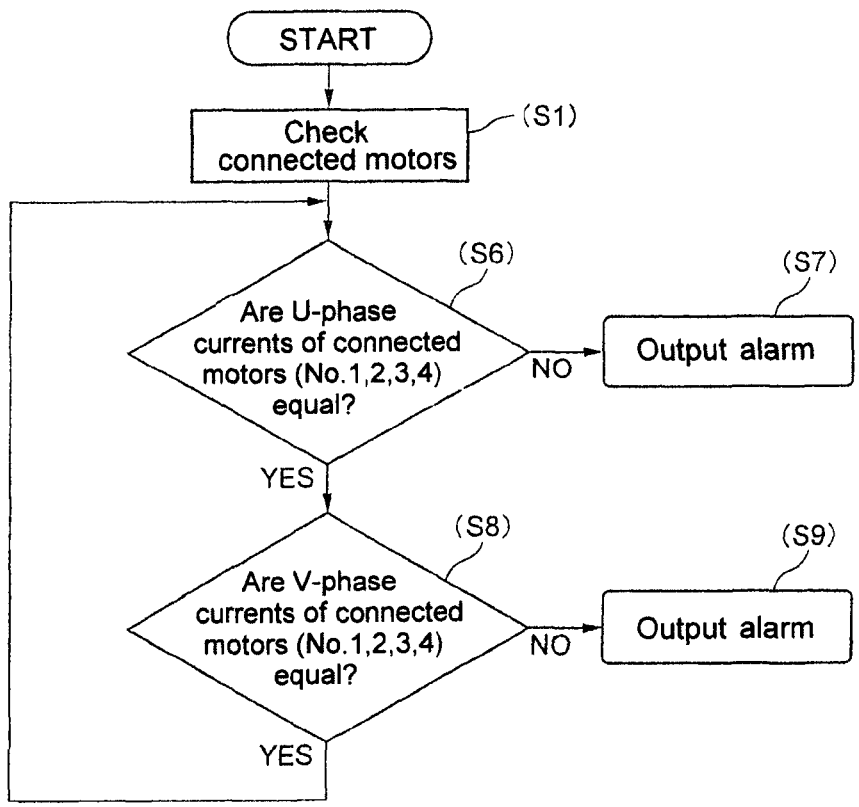
FIG. 5 is a flow chart of a program for detecting current balance.
Figure 6:
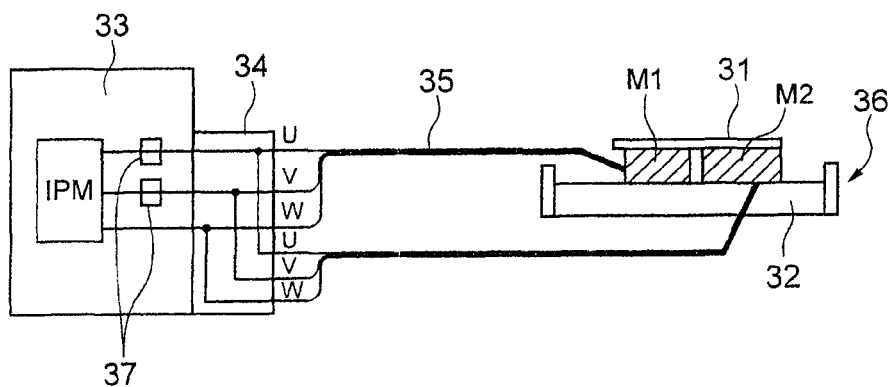
FIG. 6 is a conceptual view of a conventional power branching system.

FIG. 5 shows another flowchart of the programs executed by the CPU 22. In this flowchart, the steps for judging overload of each linear motor 5 are omitted and only the steps (S6 to S9) for determining current balance of the plural linear motors 5 are shown. As the steps (S6 to S9) for determining current balance of the plural linear motors 5 are the same as those in the flowchart of FIG. 4, the like reference numerals are added and their explanation is omitted here. In addition, the flowchart may include only the steps (S2 to S5) of judging overload of each linear motor 5 and not the steps (S6 to S9) for judging current balance of the plural linear motors 5. In other words, the steps (S2 to S5) of judging overload of each linear motor 5 and the steps (S6 to S9) for judging current balance of the plural linear motors 5 may not be used in combination but may be used alone.

The present invention is not limited to the above-described embodiments and may be embodied in various forms. For example, in the above-described embodiment, the linear motor is a permanent magnet synchronous linear motor, however, it may be a linear induction motor or it may be replaced with a rotary motor. In addition, the number of linear motors connected to the power branching system may be set to any number greater than or equal to 2.

The present specification is based on Japanese Patent Applications No. 2006-210518 filed on Aug. 2, 2006, the entire contents of which are expressly incorporated by reference herein.

The invention claimed is:

1. A power branching system for driving a plurality of linear motors synchronously by use of a single servo driver, the linear motors being connected to a rigid body, the power branching system comprising:
U-phase, V-phase and W-phase power lines branched at some midpoint to connect the plural linear motors to the servo driver;
a plurality of U-phase current sensors and a plurality of V-phase current sensors provided at branched U-phase power lines and branched V-phase power lines, respectively, for detecting U-phase and V-phase currents supplied to the respective linear motors;
controlling means for receiving data of the U-phase currents detected by the U-phase current sensors, determining whether or not the U-phase currents are balanced and generating an alarm signal when the U-phase currents are unbalanced, and also for receiving data of the V-phase currents detected by the V-phase current sensors, determining whether or not the V-phase currents are balanced and generating an alarm signal when the V-phase currents are unbalanced; and
the servo driver having a power converter, such as a voltage-type PWM inverter, for supplying power in a suitable manner to control the linear motors.

2. The power branching system according to claim 1, wherein
the controlling means calculates a difference or ratio of the currents detected by the U-phase current sensors, determines whether or not the difference is greater than or equal to a predetermined threshold value or whether or not the ratio falls within a predetermined normal range, and generates the alarm signal when the difference is greater than or equal to the predetermined threshold value or when the ratio falls outside the predetermined normal range, and
the controlling means calculates a difference or ratio of the currents detected by the V-phase current sensors, determines whether or not the difference is greater than or equal to a predetermined threshold value or whether or not the ratio falls within a predetermined normal range, and generates the alarm signal when the difference is greater than or equal to the predetermined threshold value or when the ratio falls outside the predetermined normal range.

3. The power branching system according to claim 1, wherein
the controlling means determines based on the U-phase currents detected by the U-phase current sensors whether or not any of the linear motors is overloaded, and generates the alarm signal when the linear motor is overloaded, and
the controlling means determines based on the V-phase currents detected by the V-phase current sensors whether or not any of the linear motors is overloaded, and generates the alarm signal when the linear motor is overloaded.

4. The power branching system according to claim 1, further comprising: a display device for displaying the currents detected by the U-phase current sensors and V-phase current sensors.

5. A power branching system for driving a plurality of linear motors synchronously by use of a single servo driver, the linear motors being connected to a rigid body, the power branching system comprising:
U-phase, V-phase and W-phase power lines branched at some midpoint to connect the plural linear motors to the servo driver;
a plurality of U-phase current sensors and a plurality of V-phase current sensors provided at branched U-phase power lines and branched V-phase power lines, respectively, for detecting U-phase and V-phase currents supplied to the respective linear motors;
controlling means for receiving data of the U-phase currents detected by the U-phase current sensors, determining based on the currents whether or not any of the linear motors is overloaded, and generates an alarm signal when the linear motor is overloaded, and also for receiving data of the V-phase currents detected by the V-phase current sensors. determining based on the currents whether or not any of the linear motors is overloaded, and generates an alarm signal when the linear motor is overloaded; and
the servo driver having a power converter, such as a voltage-tvpe PWM inverter, for supplying power in a suitable manner to control the linear motors.

6. A power branching method for driving a plurality of linear motors synchronously by use of a single servo driver, the linear motors being connected to a rigid body, the power branching method comprising:
branching U-phase, V-phase and W-phase power lines at some midpoint to connect the plural linear motors to the servo driver;
providing a plurality of U-phase current sensors and a plurality of V-phase current sensors at U-phase branched power lines and V-phase branched power lines, respectively, to detect currents supplied to the respective linear motors determining whether or not the U-phase currents detected by the U-phase current sensors are balanced, and generating an alarm signal when the U-phase currents are unbalanced;

determining whether or not the V-phase currents detected by the V-phase current sensors are balanced, and generating an alarm signal when the V-phase currents are unbalanced; and providing the servo driver with a power converter, such as a voltage-type PWM inverter, for supplying power in a suitable manner to control the linear motors.

7. A power branching method for driving a plurality of linear motors synchronously by use of a single servo driver, the linear motors being connected to a rigid body, the power branching method comprising:

branching U-phase, V-phase and W-phase power lines at some midpoint to connect the plural linear motors to the servo driver;

providing a plurality of U-phase current sensors and a plurality of V-phase current sensors at U-phase branched power lines and V-phase branched power lines, respectively, to detect currents supplied to the respective linear motors determining based on the U-phase currents detected by the U-phase current sensors whether or not any of the linear motors is overloaded, and generating an alarm signal when the linear motor is overloaded determining based on the V-phase currents detected by the V-phase current sensors whether or not any of the linear motors is overloaded, and generating an alarm signal when the linear motor is overloaded;

providing the servo driver with a power converter, such as a voltage-tvpe PWM inverter, for supplying power in a suitable manner to control the linear motors.

* * * * *